US005679970A

United States Patent [19]

Hartmann

[11] Patent Number: 5,679,970
[45] Date of Patent: Oct. 21, 1997

[54] TRIPLE GATE FLASH-TYPE EEPROM MEMORY AND ITS PRODUCTION PROCESS

[75] Inventor: Joël Hartmann, Claix, France

[73] Assignee: Commissariat a l'Energie Atomique, Paris, France

[21] Appl. No.: 360,685

[22] PCT Filed: Jul. 1, 1993

[86] PCT No.: PCT/FR93/00667

§ 371 Date: Feb. 2, 1995

§ 102(e) Date: Feb. 2, 1995

[87] PCT Pub. No.: WO94/01892

PCT Pub. Date: Jan. 20, 1994

[30] Foreign Application Priority Data

Jul. 3, 1992 [FR] France ................... 92 08231

[51] Int. Cl.⁶ ............... H01L 21/8247; H01L 29/788
[52] U.S. Cl. ................ 257/320; 437/43; 437/52
[58] Field of Search ................ 437/43, 52; 257/320

[56] References Cited

U.S. PATENT DOCUMENTS 5,420,060  5/1995  Gill et al. ................... 437/52

FOREIGN PATENT DOCUMENTS 0 047 153  3/1982  European Pat. Off. .
61-239671 10/1986  Japan .

OTHER PUBLICATIONS

Solid State Technology, vol. 30, No. 10, Oct. 1987, Washington US, pp. 149–152, Lee et al., "High Speed EPROM Process Technology Development".

IEEE International Solid State Circuits Conference, vol. 28, 14 Feb. 1985, New York US, pp. 168–169, Masuoka et al., "A 256k Flash EEPROM using Triple Polysilicon Technology".

Primary Examiner—John Niebling
Assistant Examiner—Richard A. Booth
Attorney, Agent, or Firm—Oblon, Spivak, McClelland, Maier & Neustadt, P.C.

[57] ABSTRACT

A memory including a semiconductor substrate, an array of memory cells mutually electrically insulated by side insulators, wherein each memory cell includes a gate stack consisting of a gate insulator, a floating gate and a control gate separated by an electrical insulator between the gates, said gate insulator being arranged between the floating gate and the substrate, a source and a drain formed in the substrate on either side of said stack and outside the side insulators, an erasing gate located above the source in partial overlap with the stack, and electrically insulated from the source and said stack by a thin insulator, as well as conductive strips for applying electrical signals to the gate stacks, erasing gates, sources and drains.

13 Claims, 4 Drawing Sheets

TRIPLE GATE FLASH-TYPE EEPROM MEMORY AND ITS PRODUCTION PROCESS

BACKGROUND OF THE INVENTION

1. Field of the Invention

The present invention relates to an integrated EEPROM, i.e. an electrically erasable programmable read-only memory, as well as to its production process. This memory is of the flash type.

The invention more particularly applies to the field of production of integrated memory circuits of the MOS or CMOS type having high integration densities.

2. Discussion of the Background

An integrated EEPROM is an integrated circuit having a memory part formed from an array of several memory cells, which are electrically interconnected, and peripheral circuits for controlling said memory cells.

The present invention only relates to the memory part.

The concept of the flash EEPROM was introduced for the first time in 1984 by Toshiba, which proposed a triple gate structure, namely a floating gate, a control gate for programming and reading and an erasing gate made from polycrystalline silicon. This memory had a large size and, for the 2 μm design rules (or floating gate width), memory cells with a surface of 64 μm². This structure was very rapidly abandoned, because it did not permit large integration dimensions, i.e. the storage of at least $10^6$ bits with submicron design rules.

The major development of the flash memory concept, whose main interest is high memory capacities for the replacement of hard or floppy disks in personal microcomputers, was provided in 1988 by Intel with The introduction of the so-called ETOX cell, which has the great advantage of being similar to an EPROM cell.

This cell is in particular described in IEEE Journal of Solid State Circuits, vol. 24, No. 5, October 1989, pp 1259–1263, "A 90-ns one-million erase/program cycle 1 - Mbit flash memory" by V. N. Kynett et al. Each ETOX memory cell has a single double gate transistor, whose special feature is the gate oxide thickness which is reduced to around 10 nm in order to permit an erasing by tunnel effect of the floating gate.

The programming and reading of this memory are identical to those of an EPROM. For each memory cell, erasing is carried out by transferring a voltage of 12 V to the source of the transistor, whilst maintaining its control gate at ground. The electrons of the floating Eats are collected by the source by the tunnel effect through the thin gate oxide of the cell. As the source is common no all the cells of the memory plane, erasing is collective and the entire memory can be erased in a single operation.

Therefore this means opened the way to significant integration densities and numerous companies adopted this memory cell concept. However, although this concept is very interesting from the integration density standpoint, it suffers from several problems of an electrical nature.

Thus, the use of a high voltage (12 V) on the source generally brings about the avalanching of the source-substrate junction of the cell, which leads to holes being injected into the cell gate oxide and causes electrical faults.

Moreover, the high current used during erasing requires a 12 V external supply, so that it is not possible to obtain compatibility with an external circuit supply of 5 V.

Moreover, as the thickness of the gate oxide is reduced to 10 nm or less, all the parasitic effects of an EPROM cell are amplified and are prejudicial to the operation thereof. In particular, the parasitic conduction phenomenon of cells belonging to the same line of bits as the cell being addressed (or turn-on) is increased, programming becomes more difficult and there is a significant writing of parasitic information or soft-write.

Finally, the approximately 10 nm gate oxide is subject to premature ageing due to hot electrons injected from the side of the drain during programming and the injection of hot holes during the erasing on the side of the source. Therefore said oxide ages very rapidly and it is difficult to withstand 10,000 reading-writing cycles with this memory cell type.

Recently, to get round these major problems, using the same type of memory cell, it has been proposed to supply a negative voltage of approximately −10 to −12 V to the floating gate during erasing, which makes it possible to reduce the voltage applied to the source to 5 V, use corresponding control circuits operating at 5 V and eliminate the avalanche of the source-substrate junction.

Such a method is described in the document "A new flash $E^2$PROM cell using triple polysilicon technology", by Fujio Nasuoka et al, IEDM 1984, pp 464–467 and in the document "A 5V-Only 0.6 μm flash EEPROM with row decoder scheme in triple-well structure" by Masao Kuriyama et al, IEEE 1992, pp 152–153.

This solution is attractive from the electrical standpoint, but gives rise to a design problem, because it is difficult no produce and carry a negative voltage on an integrated circuit solely supplied with 5 V or 0 V.

EP-A-47 153 describes a triple gate EEPROM in which the erasing gate of each memory cell is formed above the source and astride the control gate-floating gate stack and in which it is insulated from the source by the thick field oxide (500 nm to 1 μm).

This memory still uses very high erasing voltages (20 to 30 V) and its programming takes place by tunnel effect between the floating gate and the substrate by the application of high positive voltages (20 to 30 V) to the control gate. This type of programming requires the use of a selection transistor for each cell (i.e. two transistors per cell) so as to avoid the parasitic programming of all the cells common to the same control gate. The use of a selection transistor does not permit a total erasing (or flash).

In addition, ouch a cell is very large and prevents integration densities in excess of a few dozen kilobits and this in particular applies because the control gate is not cell-aligned with respect to the floating gate. Moreover, the thick field oxide of this memory has a large "bird beak" (0.5 to 1 μm overlap of the oxide) preventing the use of this process for floating gate widths below 2 μm.

Finally, the lateral diffusion of the $N^+$ junction beneath the field oxide serving as a source is significant, which also limits the integration density and makes difficult conventional programming by hot electrons as a result of the channel length fluctuation.

SUMMARY OF THE INVENTION

The invention is directed at an integrated EEPROM of the flash type and to its production process making it possible to obviate the various disadvantages mentioned hereinbefore. In particular, this memory can be supplied with voltage sources of 5 V and therefore without electrical problems at the gate oxide, which can remain identical to that of a conventional EPROM, i.e. above 10 nm and consequently not having the aforementioned parasitic effects. In addition, the integration density of the EEPROM according to the invention is identical to that of EPROM memories and is consequently very high and its operation is similar to that of EPROM's.

Therefore, the invention proposes a triple gate flash EEPROM produced in accordance with a conventional T structure having no significant affect on the integration density. DP-A-349,724 and EP-A-430,426 already disclose triple-gate, integrated EEPROM memories. EP-A-320,239 and 20th European Solid-State Device Research Conference, vol. 20, pp 177–180, Sept. 1990 also disclose flash-type EEPROM memories. A process for the production of a semiconductor memory is also known from Patent Abstracts of Japan, vol. 11, no. 83, March 1987 and JP-A-61239671.

More specifically, the invention relates to a triple gate integrated EEPROM memory of the flash type including a semi-conductor substrate, an array of memory cells electrically insulated from one another by lateral insulations formed on the substrate, each memory cell including a stack of gates constituted by a gate insulator, a floating gate end a control gate separated by an inter-gate electrical insulator, the gate insulator being interposed between the floating gate and the substrate, a source and a drain formed in the substrata on either side of said stack and outside the lateral insulations, an erasing gate formed above the source and partly astride the snack, said erasing gate being electrically insulated from the source and the gates of said stack by a thin insulator, the erasing gates being all electrically interconnected, and conductive strips for applying electrical signals respectively to the stacks of gates, the erasing gates, the sources and the drains.

According to the invention, it is possible to use floating, control and erasing gates made from metal (Al and its alloys, W), a silicide of a refractory metal ($TiSi_2$, $TaSi_2$, $WSi_2$) or preferably phosphorus-doped polycrystalline silicon (0.5 to 2% by weight), in the particular case of a silicon substrate.

Following the programming of a memory cell according to the invention and the injection of electrons into the corresponding floating gate, erasing takes place by polarizing the erasing gate to a potential of approximately 10 to 12 V. The thickness of the electrical insulator used between the floating gate and the erasing gate is adjusted so as to permit the passage of electrons to said erasing gate by tunnel effect from the floating gate. Thus, the gate insulator of the memory cells can have a thickness in excess of 10 nm, unlike in the case of ETOX memories.

Thus, the operation of the memory according to the invention in programming and in reading is strictly identical to that of an EPROM. Thus, it is possible to follow the development of the integration density of EPROM's for the memory according to the invention (a few dozen megabits).

In particular, the positioning of the erasing gate according to the invention makes it possible no carry out the erasing of the cell without increasing its surface, whilst permitting a collective erasing of the memory (flash).

Moreover, the use of low erasing voltages (12 V) makes it possible to have a thin insulator between the source and the erasing game of each memory cell and conversely with a thickness at the most equal to 40 μm, but exceeding 10 nm.

The gate insulator is generally of silicon oxide, but could be of silicon nitride or silicon oxynitride.

The inter-gate insulators, including those between the floating gates and the erasing gates can be of any random type of insulating material such as $SiO_2$, $Si_3N_4$, $SiO_xN_y$ with $0<x<2$ and $0<y<4/3$. In particular, the insulator intercalated between the floating gates and the control gates is a three-layer stack of silicon dioxide, silicon nitride and silicon dioxide, generally designated ONO.

The invention also relates to a process for the production of an EEPROM, like that described hereinbefore.

According to a first variant the process according to the invention comprises the following stages:

a) producing lateral insulations, b) producing said stacks between the lateral insulations and the conductive strips for the application of electrical signals to said stacks, c) formation of a thin electrical insulator layer on the source and drain areas and on the flanks of the stacks, d) implantation of ions in the substrate of a conductivity type opposite to that of the substrate in order to form therein the sources and drains, the stacks serving as a mask to said implantation performed through the thin insulator layer, as well as the conductive strips for the application of electrical signals to the erasing gates, e) deposition of a conductive layer on the thin insulator layer, f) etching solely of said conductive layer in order to form erasing gates above the sources and partly astride the stacks, g) insulation of the surface of the structure obtained in f), and h) producing contact holes in the surface insulation for the sources and drains and then producing conductive strips for applying electrical signals to the sources and drains.

According to a second variant of the process according to the invention, the following stages are performed:

A) producing lateral insulations,

B) producing said stacks between the lateral insulations and the conductive strips for applying electrical signals to said stacks, C) formation of a thin electrical insulator layer on the source and drain areas and on the flanks of the stacks, D) deposition of a conductive layer on the thin insulator layer, E) etching solely of said conductive layer in order to form erasing gates above the source areas and partly astride the stacks, F) implantation of ions in the substrate through the thin insulator layer and conductive layer, in order to form the sources and drains having a conductivity type opposite to that of the substrate, the stacks serving as a mask to said implantation, as well as the conductive strips for the application of electrical signals to the erasing gates, G) surface insulation of the structure obtained in F), and H) producing contact holes in the surface insulation for the sources and drains and then producing conductive strips for applying the electrical signals to the sources and drains.

In this second variant, it is necessary to use a higher energy ion implantation than in the first variant (approximately 150 to 180 keV) in order to pass through the thickness of the erasing gates. However, this solution has the advantage that the implantation is automatically positioned relative to the erasing gates and is separated from the stack of gates or the double gate by the thickness of said erasing gates.

It is therefore possible to control the current of each memory cell with the aid of the potential applied to said erasing gate, which then acts like the control gate of a MIS-type monogate transistor connected in series with each memory cell and thus makes it possible to render the latter insensitive to parasitic latch-ups.

In the case of a substrate, floating and control gates of silicon, the thin insulator layer is obtained by the thermal oxidation of the silicon.

BRIEF DESCRIPTION OF THE DRAWINGS

The invention is described in greater detail hereinafter relative to non-limitative embodiments and with reference to the attached drawings, wherein.

DESCRIPTION OF THE PREFERRED EMBODIMENTS

The invention is applicable both to a N-tips silicon substrate and to a P-type substrate. Moreover, the transistors to which the invention applies car be of the N or P-type. When using CMOS structures, it is necessary at the start of the process to make N or P-type recesses as a function of the nature of the substrate used.

The following description refers to the use of a P-type monocrystalline silicon substrate and to the production of N channel transistors in said substrate.

Figure 1:
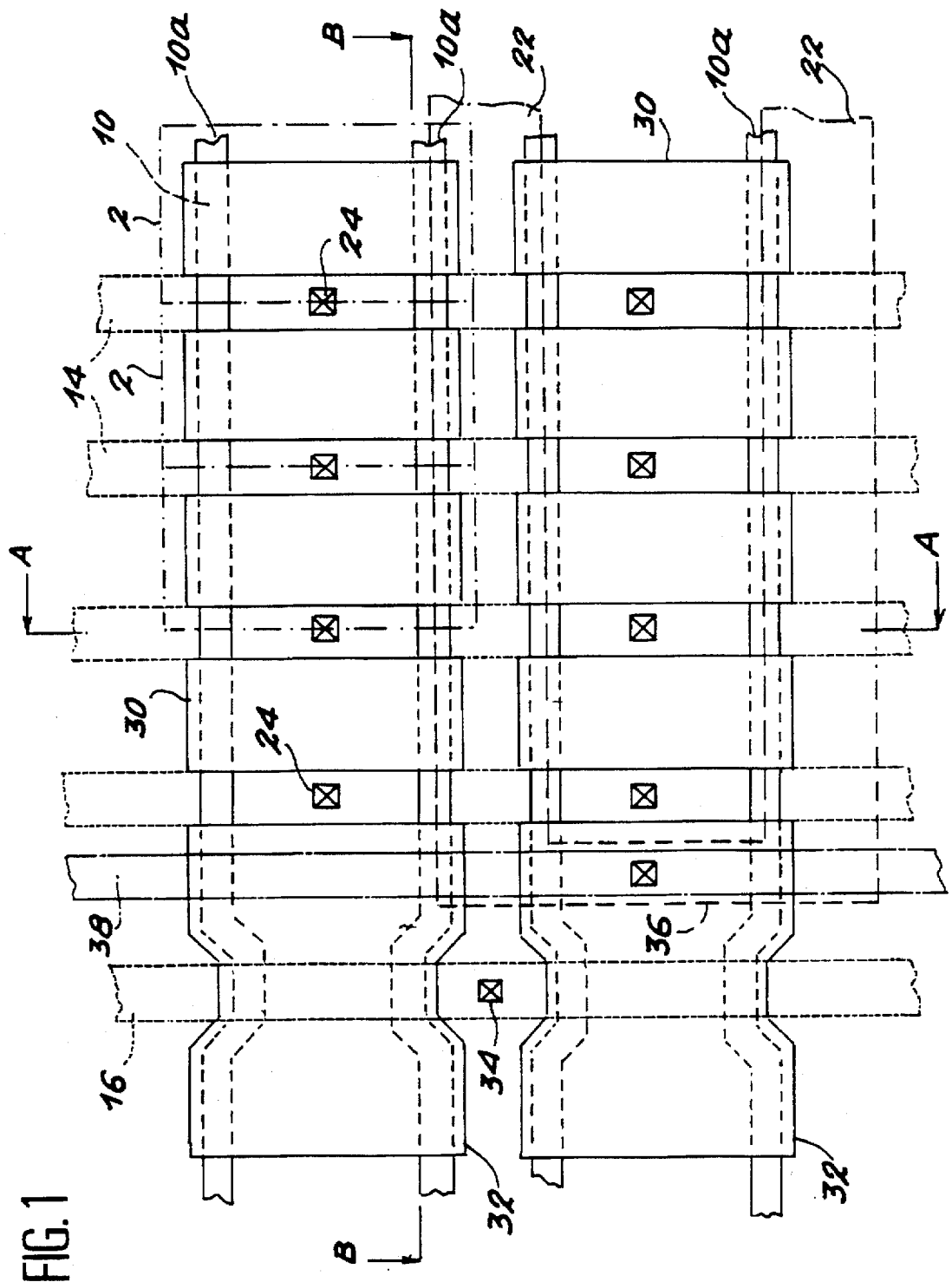
FIG. 1 A plan view of part of an EEPROM according to the invention showing the connection of the erasing gates.
Figure 2:
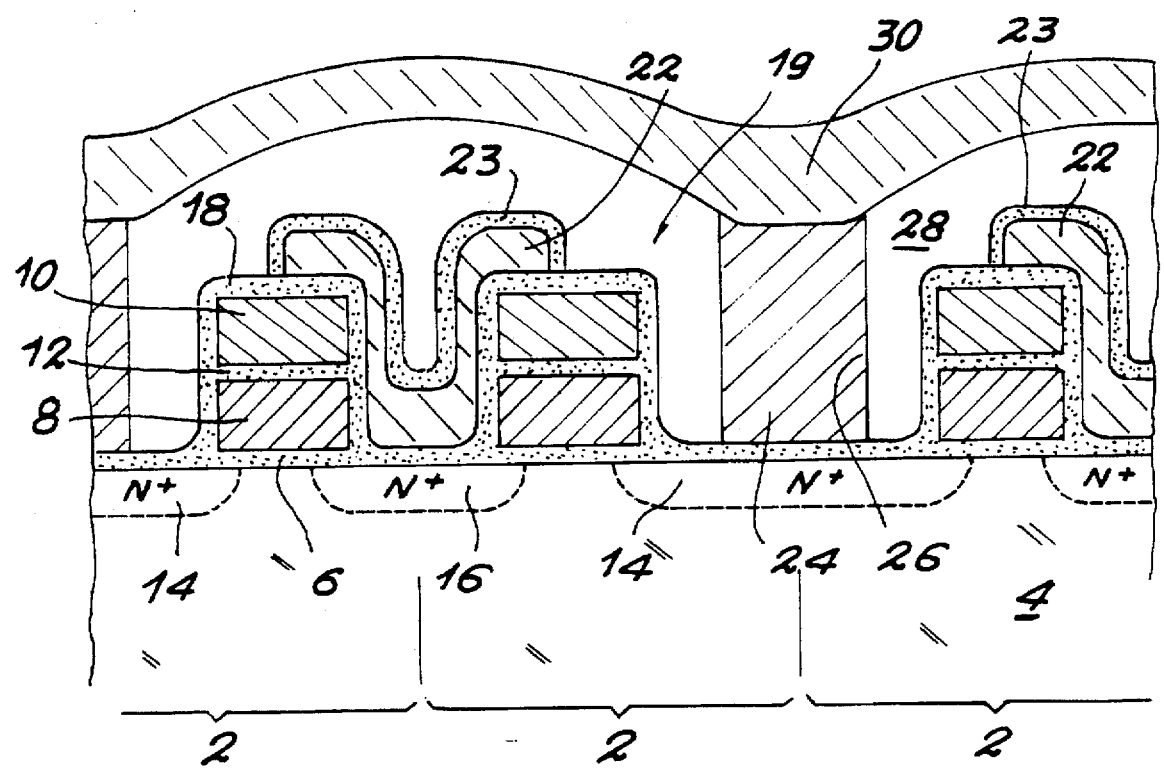
FIGS. 2a & 2b show sectional views of FIG. 1 respectively along line A—A (or the bit line) and line B—B (or word line).
Figure 2:
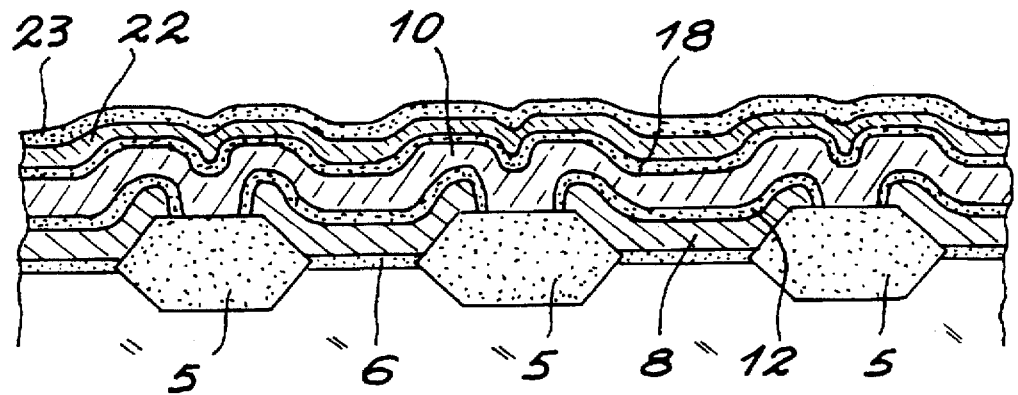

With reference to FIGS. 1, 2a and 2b, the flash EEPROM according to the invention has memory cells 2 formed on a substrate 4 and insulated from one another by a LOGOS-type field oxide 5.

Each memory cell 2 according to the invention has a gate oxide 6, typically 20 nm in place of 10 nm in the case of the prior arm memory, an approximately 150 μm floating gate 8 made from phosphorus-doped polycrystalline silicon, called poly-1, an approximately 150 nm control gate 10 made from phosphorus-doped polycrystalline silicon, called poly-2 and insulated from the floating gate 8 by an inter-gate insulator 12.

The insulator 12 is constituted by a three-layer stack, namely a silicon dioxide layer covered by a thin silicon nitride layer, then a thin silicon dioxide layer. The stack is equivalent to a 20 nm thick $SiO_2$ layer.

On either side of each gate stack 19 and outside the field oxide 5, there are two areas diffused into the substrate 14 and 16 respectively serving as the drain and source and having a $N^+$ conductivity opposite to that of the P substrate. The stacks of gates and sources and drains is covered with a 20 nm thick, thin oxide layer 18.

According to the invention, each memory cell 2 includes an erasing gate 22 made from approximately 150 to 200 nm thick, doped polycrystalline silicon, called poly-3. This erasing gate 22 is formed above the source 16 of the corresponding transistor and is insulated therefrom by the insulator layer 18. In addition, the erasing gate 22 rises on the flank of the stack 19 of floating and control gazes and ends above said stack. The layer 18 then ensures the insulation of the erasing gate 22 from the floating gate 8 and the control gate 10.

For two juxtaposed memory cells, the two erasing gates are integral and form a U.

In this type of memory, each source 16 and each drain 14 is common to two adjacent memory cells, Thus, each cell 2 incorporates an electric, metal half-contact 24 on the drains. Each contact is constituted by a tungsten element formed in the openings 26 of a phosphorus and boron-doped glass, insulating layer 28 (BPSG) covering the complete memory.

There are parallel metal strips 30 in contact with the contact elements 24 for applying the necessary voltages to the drains. These aluminium strips 30 in each case constitute a bit line.

As shown in FIG. 1, the control gates 10 of the memory cells are interconnected and in part constitute the word lines 10a of the memory, which are parallel to one another and perpendicular to the lines 30 and are made from poly-2. The control voltages to be applied to the control gates are provided by these word lines 10a.

The supply voltages are applied to the sources with the aid of parallel conductive strips 32 formed above the insulating layer 28 in the same metal layer as the bit lines. The insulating layer 28 has for this purpose openings in which are formed electrical contacts 34 similar no the drain electrical contact. Generally there is one source line 32 every 16 bit lines.

According to the invention, the erasing gates 22 are all electrically interconnected in particular with the aid of poly-3 transverse strips 36. A conductive strip 38 in electrical contact with the transverse portions 36 ensures the application of the erasing voltage in simultaneous manner to the erasing gates 21 of the memory cells. This strip 38 is formed parallel to the sources 16 and is produced by a line diffused in the substrate, at the sate time as the areas 14 and 16.

Figure 3:
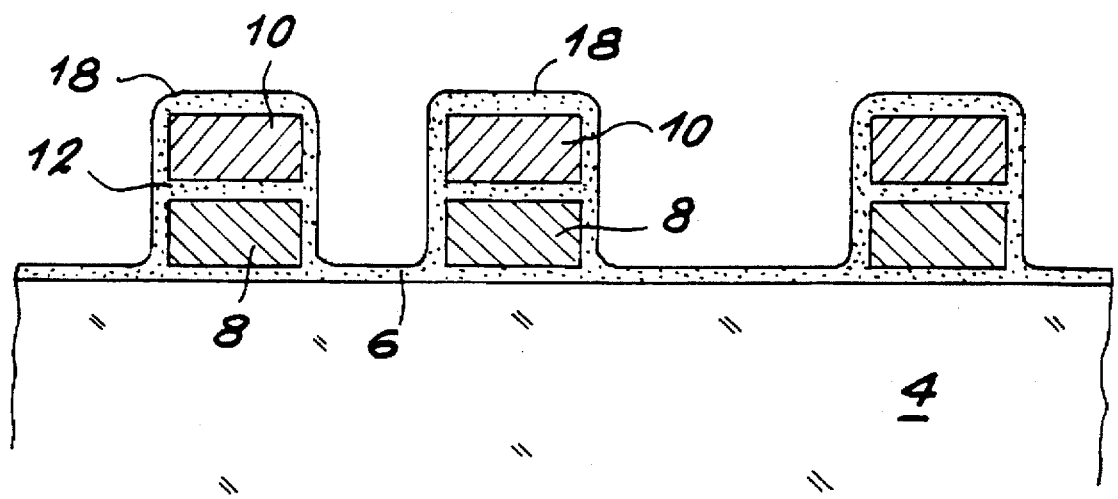
FIGS. 3 Diagrammatically shows a production stage in a section taken along a word line.
Figure 4:
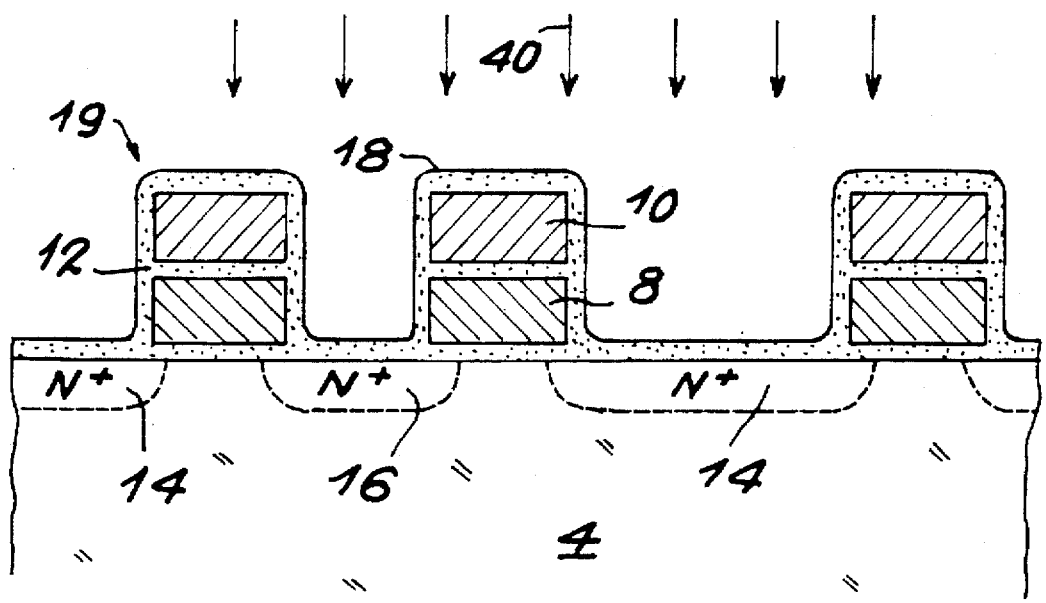
FIG. 4 Diagrammatically shows a further production stage in a section taken along a word line.
Figure 5:
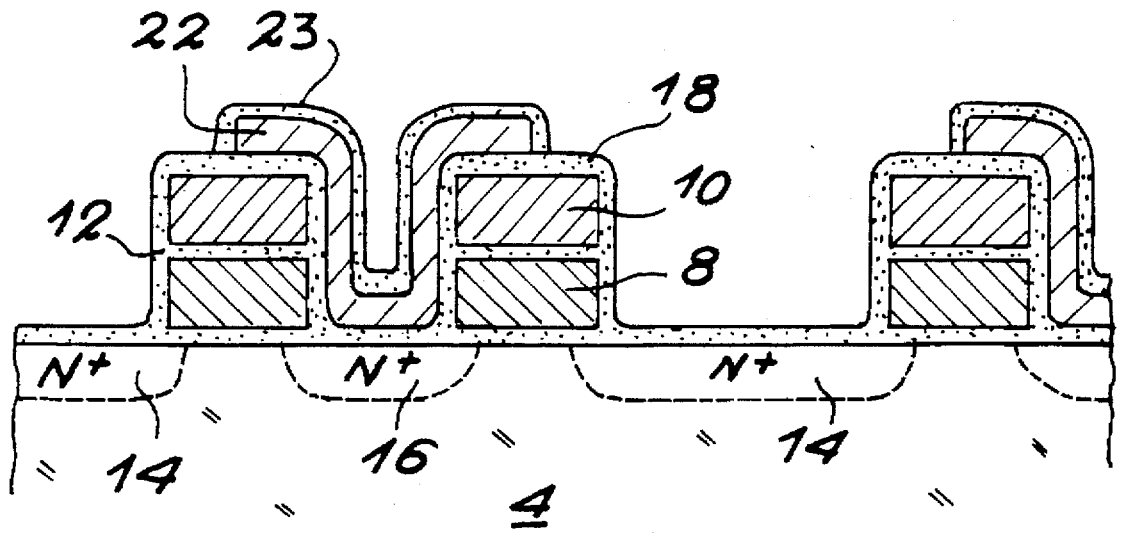
FIG. 5 Diagrammatically shows a still further production stage in a section taken along a word line.

With reference to FIGS. 3 to 5, a description will now be given of the production of a flash EEPROM according to the invention.

Before carrying out the field insulation 5, there is a thermal oxidation of the silicon at 1000° C. under dry oxygen in order to form the gate insulator 6 on the complete structure. This is followed by the adjustment of the threshold voltage of the memory cells by boron ion implantation at a typical energy of 30 keV and a dose of $10^{12}$ at/$cm^2$. This is followed by the deposition of the first polycrystalline silicon level by low pressure chemical vapour deposition (LPCVD) at 620° C. in order to produce the floating gates 8, followed by a doping by thermal diffusion of $POCl_3$ at 950° C. for 30 min.

This is followed by an etching of the poly-1 in order to fix the length of the floating gates 8 (measured in accordance with the plane of FIG. 2b) by a conventional photolithography process using reactive ion etching (RIE) with $SF_6$.

The inter-gate insulator 12 is then produced between the floating and control gates, whilst carrying out a thermal oxidation of the poly-1, a silicon nitride deposition by LCVD at 800° C. and then a thermal reoxidation of said nitride. This is followed by the deposition of the second polycrystalline silicon layer on the complete structure which is phosphorus doped in the manner described hereinbefore.

A photolithography stage defines the control gates 10 of the memory cells in poly-2. The etching of these control gates is carried out by the with a mixture of $SF_6/Cl_2$ in order to etch the second polycrystalline silicon layer and thus fix the width of the gates 10 and the word lines 10a, and a mixture of $SF_3$ for etching the inter-gate dielectric 12. This is followed by the etching of the floating gates in self-aligned manner relative to the control gates using RIE with a mixture of $HBr/Cl_2$ with stopping on the gate oxide 6 and thus fixing the width of the floating gates.

This is followed by a reoxidation of the complete structure at 1000° C. and under dry oxygen, so as to grow the insulator 18 above the source and drain regions, the stack 19 of gates and the flanks of said stack. The structure obtained is shown in FIG. 3.

As shown in FIG. 4, this is followed by an ion implantation 40 to produce the drains 14 and sources 16 of transistors e.g. with the aid of arsenic at 80 keV for a dose of $5.10^{15} at/cm^2$. This implantation takes place using stacks of gates 19 as the mask. It also ensures the formation of the control strips 38 of the erasing gates.

Following the thermal activation of said ion implantation, e.g. at 900° C. for 30 min and under nitrogen, as shown in FIG. 5, there is a deposition of the third polycrystalline silicon level by LPCVD at 620° 0 and using silane. This silicon is then doped by $POCl_3$ an 950° C.

By photolithography there is then an etching of the third polycrystalline silicon layer in order to fix the shapes of the erasing gates 22. Etching takes place by RIE using a mixture of chlorine and HBr. After producing the erasing gates 22, the process again becomes conventional.

The sequence of the process comprises:

the reoxidation 23 of the thus formed third gate by thermal oxidation at 950° C. and under dry oxygen with a typical thickness or the flanks of the polycrystalline silicon of 30 nm, the deposition 28 of boron and phosphorus-doped glass by atmospheric pressure chemical vapour deposition (APCVD) with a typical thickness of 700 nm, the creep of said doped glass by a heat treatment at 950° C. under $N_2$ and for 30 min, the production of contact holes 26 and 34 in the layer 28 by photolithography and dry RIE using $CHF_3$, the deposition by cathodic sputtering on the complete structure of an aluminium layer with 1% silicon over a typical thickness of 700 nm, the production of bit lines 30 and source lines 32 in said Al-Si layer by photolithography and dry RIE with $BCl_3$.

Finally, a not shown, passivating layer, generally formed from a phosphorus-doped glass, is deposited by APCVD over a typical thickness of 1 μm on the complete structure.

Figure 6:
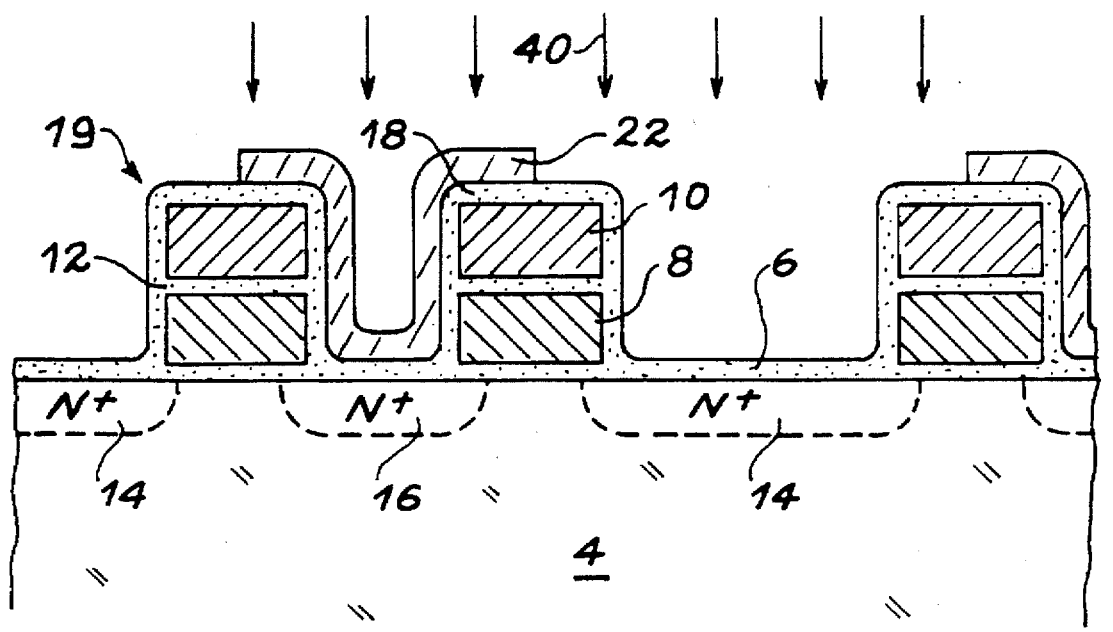
FIG. 6 Diagrammatically shows a variant process production stage in a section taken along a word line.

In a variant shown in FIG. 6, there is deposition and then etching of the third polycrystalline silicon level in order to form erasing gates 22, followed by ion implantation 40 of sources 16 and drains 14 through the gates 22 and the gate insulator, using the stacks 19 as the mask. The implantation dose is the same as previously, but the implantation energy is higher (150 to 180 keV).

What is claimed is:

1. A triple gate integrated flash EEPROM memory having a semiconductor substrate with an array of memory cells, each memory cell being electrically insulated from a neighboring cell in at least one array direction by lateral thick insulating areas formed on the substrate, wherein each memory cell comprises:

a stack including a gate insulator layer formed on the substrate, a floating gate formed on the gate insulator layer and overlapping the lateral thick insulating areas separating neighboring array cells along the at least one array direction, an inter-gate electrical insulator layer formed on the floating gate, and a control gate formed on the inter-gate electrical insulator layer;

a source formed in the substrate on a first side of the stack separated from the lateral thick insulating areas;

a drain formed in the substrate on a second side of said stack, opposite to the first side and separated from the lateral thick insulating areas;

an erasing gate formed overlying the source and having at least one portion extending along at least one side and at least part of the top of the stack;

a thin insulating layer between the erasing gate and the source and between the at least one portion of the erasing gate and the top of the stack; and wherein a first conductive arrangement is provided to interconnect each erasing gate of all of the memory cells of the array, a second conductive arrangement is provided to apply electrical signals to the control gate of each stack of each memory cell, a third conductive arrangement is provided to apply electrical signals to each source of each memory cell, and a fourth conductive arrangement is provided to apply electrical signals to each drain of each memory cell.

2. The memory device according to claim 1, wherein the substrate comprises silicon and the erasing gate of each memory cell comprises doped polycrystalline silicon.

3. The memory device according to claim 2, wherein the gate insulator layer of each memory cell comprises silicon dioxide having a thickness greater than 10 nm.

4. The memory device according to claim 1, wherein the inter-gate electrical insulator layer of each memory cell comprises an oxide, nitride and silicon dioxide sub-layer arrangement.

5. The memory device according to claim 1, wherein the thin insulating layer of each memory cell has a thickness no greater than 40 nm.

6. The memory device according to claim 1, wherein the first conductive arrangement includes conductive regions diffused in the substrate.

7. The memory device according to claim 1, wherein the floating gate of each memory cell is provided in a self-aligned manner relative to the control gate of each memory cell.

8. A process for making a triple gate integrated flash EEPROM memory device including a semiconductor substrate, having a first conductivity type and an array of memory cells, with each memory cell being electrically insulated from a neighboring memory cell in at least one array direction by lateral thick insulating areas on the substrate, wherein each memory cell includes a stack having a gate insulator layer on the substrate, a floating gate on at least the gate insulator layer, an inter-gate electrical insulator layer of the floating gate, and a control gate on the inter-gate electrical insulator layer, a source in the substrate on a first side of the stack separated from the lateral thick insulation areas and a drain in the substrate on a second side of said stack opposite to the first side and separated from the lateral thick insulating areas, an erasing gate overlying the source and having at least one portion extending along a flank of the stack to a position at least partly astride the stack, a thin insulating layer between the erasing gate and the source and between the at least one portion of the erasing gate and the stack, and wherein a first conductive arrangement is connected to each erasing gate of all of the memory cells, a second conductive arrangement is connected to apply electrical signals to the control gate of each stack of each memory cell of the array, a third conductive arrangement is connected to apply electrical signals to each source of each memory cell of the array, and a fourth conductive arrangement is provided to apply electrical signals to each drain of each memory cell of the array, said process comprising the following steps:

producing said lateral thick insulation areas on the substrate for each memory cell;

producing each said stack on the substrate for each memory cell between the lateral insulation areas and providing the second conductive arrangement connected to said control gate of each stack of each memory cell;

forming the thin insulating layer on each stack and stack flank and on at least the exposed substrate adjacent to each stack to also cover substrate source and drain areas for each of the array cells;

using the stack of each of the memory cells as a mask to implant ions of a conductivity type opposite to that of the substrate through the thin insulator layer covering the source and drain areas of the substrate adjacent to each stack of the memory cells to form the source and drain of each of the memory cells in the substrate, said implanting step further including implanting a further conductive area on the substrate forming at least a part of the first conductive arrangement;

depositing a conductive layer on at least the thin insulating layer;

etching said deposited conductive layer in order to form each erasing gate for each memory cell overlying the source for each memory cell, with each erasing gate being etched to have at least one portion extending over at least one flank of each stack and partly astride the top of each stack;

insulating all exposed surface areas of the memory cells to form a surface insulation;

producing contact holes in the surface insulation for access to each source and drain of the memory cells and then providing the third and fourth conductive arrangements including respective portions extending through the contact holes.

9. The process according to claim 8, wherein the substrate comprises silicon and each deposited and etched erasing gate of each memory cell comprises doped polycrystalline silicon.

10. The process according to claim 8, wherein the substrate, the floating gate and the control gate of each memory cell comprise silicon, and the thin insulating layer of each memory cell is formed by a further step of thermally oxidizing the silicon.

11. The process according to claim 8, wherein the step of forming the thin insulating layer includes forming the thin insulating layer to have a thickness no greater than 40 nm.

12. The process according to claim 9, wherein each memory cell erasing gate is insulated by the further step of thermally oxidizing each memory cell erasing gate.

13. The process according to claim 8, wherein the floating gate in each memory cell stack is self-aligned relative to the control gate in each said memory cell stack.

\* \* \* \* \*